(12) United States Patent
Petit et al.

(10) Patent No.: US 12,733,521 B2
(45) Date of Patent: Sep. 8, 2026

(54) ELECTRONIC DEVICE WITH THERMALLY COUPLED CONTACT PADS VIA MULTI-TOOTH METAL INTERFACE

(71) Applicant: STMicroelectronics (Grenoble 2) SAS, Grenoble (FR)

(72) Inventors: Luc Petit, Fontaine (FR); Jerome Lopez, Saint Jean de Moirans (FR); Karine Saxod, Porte de Savoie (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 417 days.

(21) Appl. No.: 18/207,954

(22) Filed: Jun. 9, 2023

(65) Prior Publication Data

US 2023/0411271 A1 Dec. 21, 2023

(30) Foreign Application Priority Data

Jun. 16, 2022 (FR) ...................................... 2205899

(51) Int. Cl.
*H10W 70/65* (2026.01)
*H10W 40/22* (2026.01)
*H10W 70/63* (2026.01)
*H10W 72/00* (2026.01)
(Continued)

(52) U.S. Cl.
CPC ........... *H10W 70/65* (2026.01); *H10W 40/22* (2026.01); *H10W 70/635* (2026.01); *H10W 72/248* (2026.01); *H10W 72/877* (2026.01); *H10W 90/724* (2026.01); *H10W 90/736* (2026.01)

(58) Field of Classification Search
CPC ............... H01L 23/367; H01L 23/3675; H01L 23/3677; H01L 23/3735; H01L 23/49816; H01L 23/49822; H01L 23/49827; H01L 23/49838; H01L 24/14; H01L 24/16; H01L 24/32; H01L 24/73; H10W 40/22; H10W 70/65; H10W 70/635; H10W 70/685; H10W 72/877; H10W 90/701; H10W 90/724; H10W 90/736
See application file for complete search history.

(56) References Cited

U.S. PATENT DOCUMENTS

2017/0309576 A1 10/2017 Kawabata et al.
2020/0395265 A1 12/2020 Thorne
2021/0111094 A1 4/2021 Kim et al.
(Continued)

FOREIGN PATENT DOCUMENTS

CN 105552062 A 5/2016
CN 221149994 U 6/2024

OTHER PUBLICATIONS

INPI Search Report and Written Opinion for priority application, FR 2205899, report dated Jan. 23, 2023, 8 pgs.
(Continued)

*Primary Examiner* — Wael M Fahmy
*Assistant Examiner* — Shamita S Hanumasagar
(74) *Attorney, Agent, or Firm* — Crowe & Dunlevy LLC

(57) ABSTRACT

An electronic device includes an electronic chip located between a cover and an interconnection substrate. The electronic chip has contact pads located in front of a first surface of the interconnection substrate. At least one metal region (for example extending on the front surface) thermally couples at least one contact pad of the electronic chip to the cover.

20 Claims, 2 Drawing Sheets

(51) Int. Cl.
*H10W 72/20* (2026.01)
*H10W 90/00* (2026.01)

(56) References Cited

U.S. PATENT DOCUMENTS

2022/0059427 A1* 2/2022 Kondo .............. H01L 23/49827
2022/0077049 A1 3/2022 Nakamura et al.
2022/0165638 A1* 5/2022 Akiba ..................... H01L 24/48

OTHER PUBLICATIONS

CN First Office Action and Search Report for counterpart, CN Appl. No. 202310709638.1, report dated Jan. 27, 2026, 7 pgs.

* cited by examiner

ELECTRONIC DEVICE WITH THERMALLY COUPLED CONTACT PADS VIA MULTI-TOOTH METAL INTERFACE

PRIORITY CLAIM

This application claims the priority benefit of French Application for Patent No. 2205899, filed on Jun. 16, 2022, the content of which is hereby incorporated by reference in its entirety to the maximum extent allowable by law.

TECHNICAL FIELD

The present disclosure generally concerns electronic devices and, more particularly, integrated circuit packages, and the mounting of electronic chips in these packages. Such integrated circuit packages may, for example, comprise packages of ball grid array (BGA) type.

BACKGROUND

BGA packages enable to electrically integrate an electronic chip to an external device or a printed circuit board (PCB). Such packages further enable to take part in the dissipation of the heat generated by the chip due to different thermal paths.

There is a need to improve packages for electronic chips.

SUMMARY

An embodiment overcomes all or part of the disadvantages of known packages.

An embodiment provides an electronic device comprising an electronic chip located between a cover and an interconnection substrate, wherein: a) the electronic chip comprises contact pads located in front of a first surface of the interconnection substrate; and b) at least one metal region thermally couples at least one contact pad of the chip to the cover.

According to an embodiment, said at least one metal region is in contact on the one hand with said at least one contact pad, and on the other hand with the cover, or with a first thermally-conductive layer itself in contact with the cover.

According to an embodiment, the first thermally-conductive layer is electrically insulating.

According to an embodiment, the cover is metallic.

According to an embodiment, the interconnection substrate supports connection balls on a second surface, opposite to the first surface, said at least one metal region being electrically connected to at least one connection ball.

According to an embodiment, the connection between said at least one metal region and said at least one connection ball is performed by a metal via crossing the interconnection substrate.

According to an embodiment, said at least one metal region is connected to ground.

According to an embodiment, said at least one metal region is in contact with four contact pads.

According to an embodiment, said at least one metal region has three teeth, the central tooth being coupled to two contact pads and the two other teeth being each connected to a contact pad.

According to an embodiment, a surface of the electronic chip opposite to the contact pads is in contact with a second thermally-conductive layer itself in contact with the cover.

According to an embodiment, said at least one metal region is formed in a metal layer of the interconnection substrate.

According to an embodiment, said at least one metal region is made of copper.

Another embodiment provides an assembly where the electronic device is mounted on a printed circuit or an external device.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the electronic chip has been described only by its geometry and its electronic functions have not been described, the electronic device being compatible with usual surface-mount chips.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
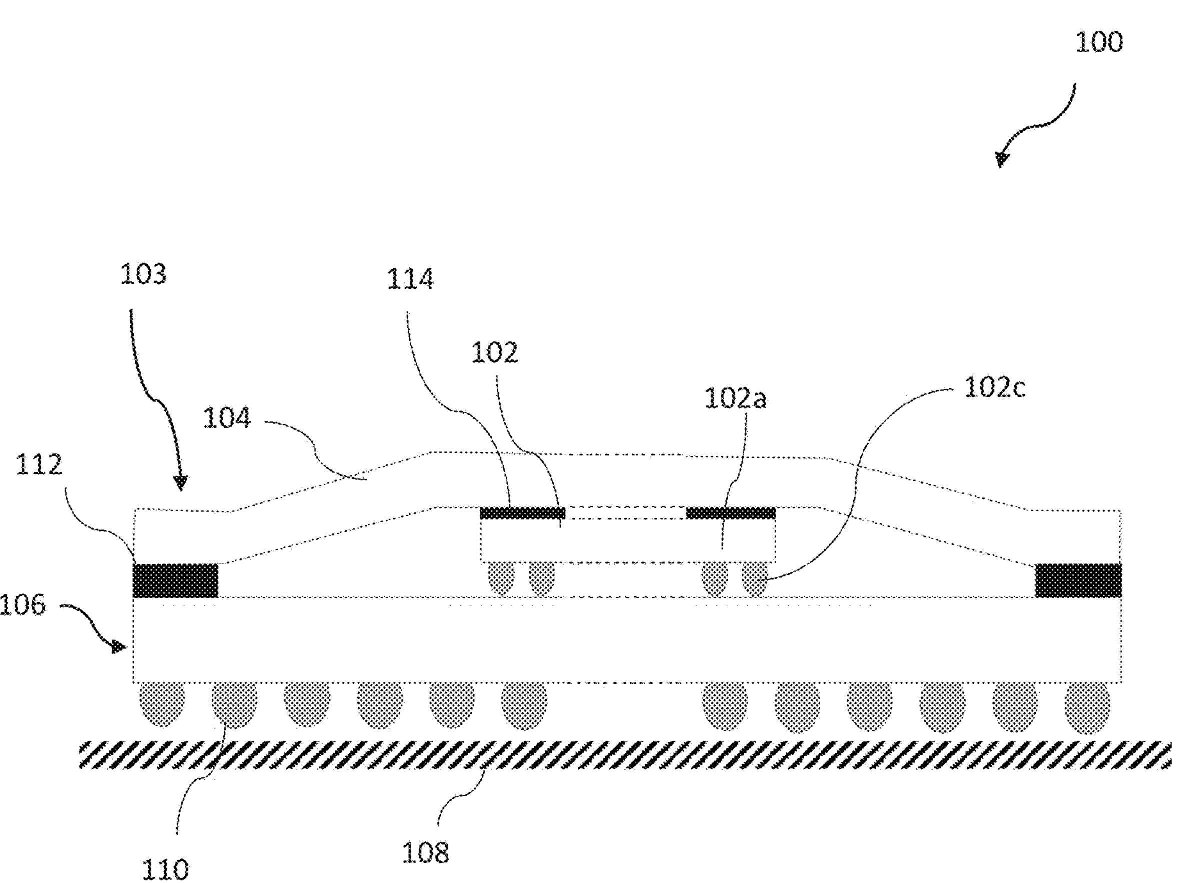
FIG. 1 is a cross-section view showing an example of an electronic device mounted on an external device.

FIG. 1 is a cross-section view showing an example of an electronic device 100 mounted on an external device 108. More particularly, electronic device 100 corresponds to an electronic integrated circuit chip 102 mounted in a package 103.

Package 103 comprises a cover 104 and an interconnection substrate 106. Such a package 103 enables to electrically couple chip 102 to the external device or printed circuit 108. For this purpose, chip 102 is electrically connected to the substrate 106, and the substrate 106 is mounted and electrically connected on the external device 108.

Electronic chip 102 comprises a body 102*a* and one or a plurality of contact pads 102*c* located on the side of a first surface of body 102*a*, that is, its lower surface in the orientation of FIG. 1. Contact pads 102*c* are located in front of a first surface of interconnection substrate 106, that is, its upper surface in the orientation of FIG. 1. Body 102*a* of chip 102 has, for example, in top view a substantially square or rectangular shape. The chip body 102*a* has, for example, dimensions in top view greater than 5 mm by 5 mm, for example, smaller than 25 mm by 25 mm, for example in the order of 15 mm by 15 mm.

The chip body 102*a* comprises, for example, integrated circuits and electronic elements, for example formed inside and/or on top of a semiconductor material. As an example, the chip body 102*a* comprises a semiconductor substrate (not detailed in the drawing), for example, made of silicon, inside and on top of which are formed electronic components, for example, transistors (not detailed in the drawing) and a stack of insulating and conductive layers referred to as an interconnection stack (not detailed in the drawing), located on the lower surface side of the substrate, having interconnection elements of the electronic components formed therein. Contact pads 102*c* are, for example, arranged on the lower surface of the interconnection stack of chip 102.

The connection between chip 102 and interconnection substrate 106 is performed via the contact pads 102*c* of the chip. As an example, contact pads 102*c* are bonded and electrically connected to corresponding contact pads (not detailed in the drawing) of interconnection substrate 106, located on the upper surface side of interconnection substrate 106. As an example, chip 102 comprises a plurality of contact pads 102*c*. The chip comprises, for example, at least some ten contact pads 102*c*, for example, at least some hundred contact pads 102*c*. As an example, contact pads 102*c* are regularly distributed on the lower surface of body 102*a*. As an example, contact pads 102*c* are arranged in an array network.

As an example, contact pads 102*c* are made of an electrically-conductive material. As an example, contact pads 102*c* are made of a metallic material. Contact pads 102*c* are, for example, made of copper, of silver, or of tin, or of an alloy, for example, based on tin and silver (SnAg).

Substrate 106 enables to mount integrated circuit chip 102 to external device 108 according to a surface-mount technique.

As an example, substrate 106 has, in top view, a substantially square or rectangular shape. As an example, substrate 106 is, in top view, larger than chip 102. Substrate 106 has, for example, dimensions in top view greater than 10 mm by 10 mm, for example smaller than 110 mm by 110 mm, for example, in the order of 25 mm by 25 mm.

Substrate 106 comprises, for example, a stack of metal and insulating levels having interconnection elements formed therein. Substrate 106 comprises, for example, metal tracks extending horizontally in the orientation of FIG. 1 (not detailed in the drawing) and/or metal vias extending vertically in the orientation of FIG. 1 (not detailed in the drawing).

Substrate 106 is connected to external device 108 via connection balls or columns 110, connecting metal contacts (not detailed in the drawing) formed on the upper surface of external device 108, to metal contacts (not detailed in the drawing) formed on a lower surface of substrate 106. Thus, interconnection substrate 106 is crossed by metal vias and supports connection balls 110 on its surface opposite to chip 102, that is, its lower surface in the orientation of FIG. 1. Balls 110 are, for example, regularly distributed on the lower surface of substrate 106, for example, in an array network.

The lateral dimensions of balls 110 and the pitch between balls 110 are, for example, greater than the lateral dimensions of contact pads 102*c* and the pitch between pads 102*c*. Substrate 106 thus performs a function of spreading and of redistribution of the contacts of chip 102 towards the contacts of the external device.

As an example, cover 104 has, in top view, a shape similar to the shape of substrate 106. As an example, in top view, the cover has a substantially square or rectangular shape. The lateral dimensions of cover 104 are, for example, identical to the lateral dimensions of substrate 106. The cover 104 of package 103 is, for example, bonded to substrate 106 by means of a layer 112. As an example, cover 104 is locally bonded to substrate 106, that is, layer 112 does not extend over the entire periphery of cover 104 and of substrate 106. As an example, cover 104 and substrate 106 are bonded to each other via layer 112 only on their four corners, cover 104 and substrate 106 thus being in contact, via layer 112, only in four places. Layer 112 is, for example, made of a bonding or adhesive layer. Layer 112 is, for example, in contact, by its lower surface, with an electrically-insulating region of substrate 106, and, by its upper surface, with the lower surface of cover 104. Cover 104 is, for example, made of metal.

The cover 104 of package 103 particularly enables to dissipate the heat accumulated in electronic chip 102. For this purpose, a thermal interface layer 114 for example forms an interface between the upper surface of chip 102 and cover 104. Layer 114 is, for example, in contact, by its lower surface, with the upper surface of chip 102, and, by its upper surface with the lower surface of cover 104. Layer 114 has, for example a thermal conductivity greater than that of air. Layer 114 is, for example, made of a thermal paste, grease, or glue.

In the example described in relation with FIG. 1, part of the heat generated by electronic chip 102 is dissipated by cover 104. In practice, thermal exchanges in such a device are not always sufficient to optimally dissipate the heat generated by the electronic chip. It is then provided hereafter to increase thermal dissipations within the device.

Figure 2A:
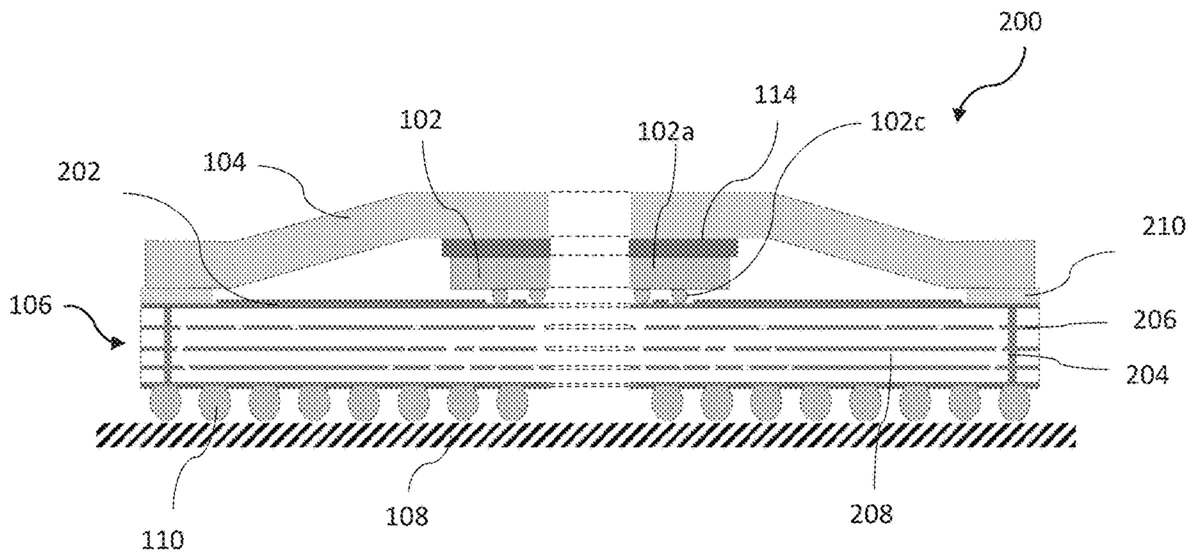
FIG. 2A is a cross-section view showing an electronic device mounted on an external device according to an embodiment.

FIG. 2A is a cross-section view showing an electronic device 200 mounted on an external device 108 according to an embodiment.

Figure 2B:
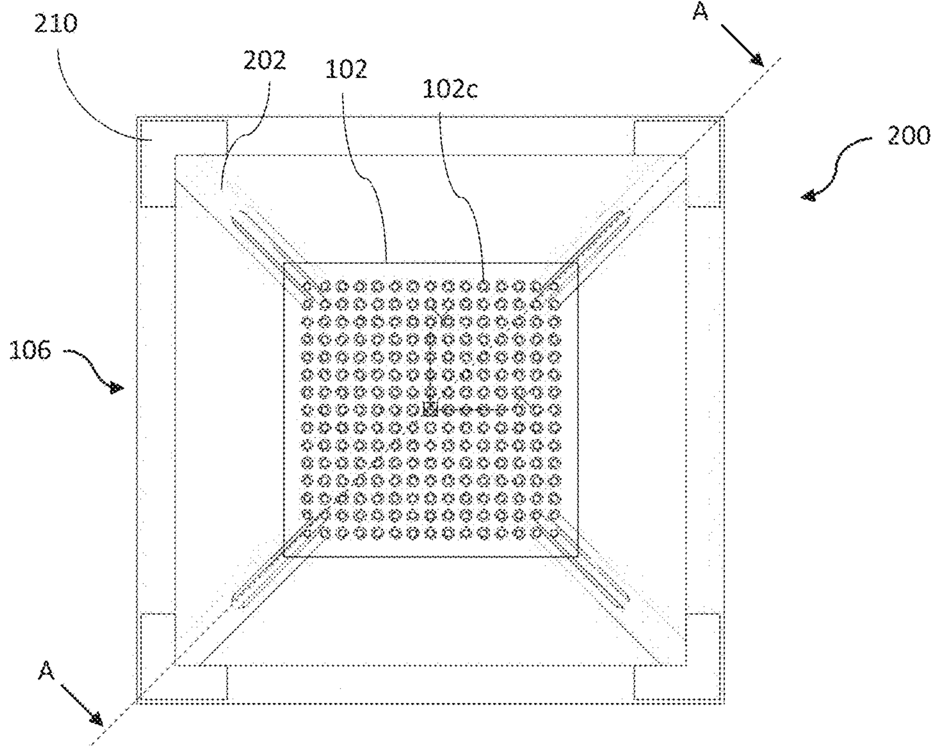
FIG. 2B is a top view of the electronic device of FIG. 2A.

FIG. 2B is a top view of the electronic device 200 of FIG. 2A. More precisely, FIG. 2B is a top view of the device 200 of FIG. 2A where certain elements have been shown in transparency, such as cover 104 and body 102*a* of chip 102. FIG. 2A is a cross-section view along cross-section plane AA of FIG. 2B.

The device 200 illustrated in FIGS. 2A and 2B is similar to the device 100 illustrated in FIG. 1 with the difference that it comprises metal regions 202, thermally coupling contact pads 102*c* to cover 104. In the shown example, metal regions 202 are further thermally coupled to connection balls 110.

Metal regions 202 are, for example, metal tracks or areas formed in an upper metal level of interconnection substrate 106.

Metal regions 202 extend, for example, in top view, from the corners of chip 102 to the corners of substrate 106. As an example, device 200 comprises four metal regions 202, each metal region extending from one corner of the chip to a corner of the substrate facing it.

As an example, metal regions 202 are connected, in the chip corners, to certain contact pads 102*c*. As an example, each metal region 202 is connected to at least one contact pad 102*c*, for example, a ground contact pad, located in a corner of the chip.

As an example, each metal region 202 is connected to four adjacent contact pads 102*c* located in a corner of the chip. In this example, metal regions 202 have the shape of a fork with three teeth where the central tooth is connected to a first contact pad 102*c* located in a corner of the chip and with a second contact pad 102*c* next to the first pad towards the center of the chip. Still in this example, the two other teeth of metal region 202 are respectively connected to third and fourth contact pads 102*c* located on either side of the central tooth. In this example, in each of the chip corners, the contact pads 102*c* connected to metal regions 202 form, for example, a square array of 2×2 contact pads 102*c*.

The substrate 106 such as illustrated in FIGS. 2A and 2B comprises, for example, a plurality of metal levels 206 or tracks, stacked and at least partially insulated from one another by insulating layers 208.

Metal regions 202 are, for example, formed in a metal layer of substrate 106, for example in the metal layer corresponding to the last metallization level of substrate 106, that is, the metal layer closest to the upper surface of substrate 106.

Substrate 106 further comprises metal vias 204 enabling to electrically connect metal tracks 206 of two consecutive levels therebetween, the tracks and vias forming an interconnection network within substrate 106. In an example, metal vias 204 at least partially cross substrate 106 and connect, for example, tracks 206 to connection balls 110.

As an example, each of metal regions 202 is electrically connected, by interconnection elements of substrate 106, for example, via a metal via 204 crossing substrate 106, to at least one connection ball 110.

Thus, according to a preferred embodiment, each metal region 202 thermally couples at least one contact pad 102*c* of the chip to at least one connection ball 110 via at least one metal via 204.

In the embodiment of FIGS. 2A and 2B, metal regions 202 create thermal paths between the contact pads 102*c* of chip 102 and cover 104, and, preferably, between contact pads 102*c* and device 108. Metal regions 202 thus enable to thermally discharge towards cover 104 and, for example, towards device 108, part of the heat generated by chip 102, in particular through the integrated circuits located on the lower surface side of chip 102.

In the example of FIGS. 2A and 2B, cover 104 is thermally coupled to metal regions 202 at the level of the corners of substrate 106. The cover may be in direct contact, that is, in mechanical contact, by its lower surface, with metal regions 202. As a variant, a thermally-conductive layer 210 forms an interface between the lower surface of cover 104 and the upper surface of metal regions 202. Layer 210 is for example in direct contact, by its lower surface, with the upper surface of metal regions 202 and, by its upper surface, with the lower surface of cover 104. As an example, layer 210 is made of a material having a thermal conductivity greater than that of air. As an example, layer 210 is made of an electrically-insulating material. As an example, the thermally-conductive material corresponds to thermal glue or to a thermal paste. As a variant, layer 210 is made of an electrically-conductive material, for example, a metal.

An advantage of the embodiment illustrated in FIGS. 2A and 2B is that it allows a better thermal dissipation of the heat generated by chip 102.

Another advantage of the embodiment illustrated in FIGS. 2A and 2B is that it allows a thermal dissipation of the heat by an upper portion of the chip and by a lower portion of the chip.

Various embodiments and variants have been described. Those skilled in the art will understand that certain features of these various embodiments and variants may be combined, and other variants will occur to those skilled in the art. In particular, although a device comprising four metal regions located at the corners of the chip and of the substrate has been described, the number of metal regions may be different from four, for example greater than four. Metal regions will then be present outside of the corners of the chip and of the substrate. As an example, the number of points of physical contact, between substrate 106 and cover 104, possibly via layer 210, is identical to the number of metal regions or lower than this number.

Further, although the metal regions have been described as being capable of being metal tracks of the substrate, they may correspond to layers formed on the upper surface of substrate 106 and coupled to substrate 106 by local contacts.

Further, the chip, the substrate, and the cover have been described as having a substantially square or rectangular shape, however they may have a different shape such as an oblong shape, a square shape having rounded edges, or any other shape. As an example, the chip, the cover, and the substrate do not all have the same shape.

Finally, the practical implementation of the described embodiments and variations is within the abilities of those skilled in the art based on the functional indications given hereabove.

The invention claimed is:

1. An electronic device, comprising:
- an interconnection substrate;
- an electronic integrated circuit chip mounted to the interconnection substrate;
- a cover;
- wherein the electronic chip is located between the cover and the interconnection substrate;
- wherein the electronic chip comprises contact pads located in front of a first surface of the interconnection substrate to which the electronic chip is mounted; and
- at least one metal region extending on the first surface of the interconnection substrate and configured to thermally couple at least one contact pad of the electronic chip to the cover;
- wherein said at least one metal region is in contact with a plurality of contact pads of the electronic chip; and
- wherein said at least one metal region has a plurality of teeth, and wherein a first tooth of said plurality of teeth is connected to a corner contact pad of the plurality of contact pads of the electronic chip, and wherein a second tooth of said plurality of teeth is connected to a further contact pad of the plurality of contact pads of the electronic chip that is adjacent to the corner contact pad.

2. The device according to claim 1, wherein the cover is metallic.

3. The device according to claim 1, wherein said at least one metal region is connected to ground.

4. The device according to claim 1, wherein said at least one metal region is formed in a metal layer of the interconnection substrate.

5. The device according to claim 1, wherein said at least one metal region is made of copper.

6. The device according to claim 1, wherein said first tooth is connected to a plurality of contact pads of the electronic chip.

7. The device according to claim 1, wherein a first end of said at least one metal region is in contact with said at least one contact pad, and wherein a second end of said at least one metal region is in contact with the cover.

8. The device according to claim 1, wherein a surface of the electronic integrated circuit chip opposite to the contact pads is in contact with a second thermally-conductive layer itself in contact with the cover.

9. An assembly, comprising:

an electronic device according to claim 1; and a printed circuit or an external device;

wherein said electronic device is mounted on said printed circuit or external device.

10. The device according to claim 1, wherein the interconnection substrate supports connection balls on a second surface, opposite to the first surface, said at least one metal region being electrically connected to at least one connection ball.

11. The device according to claim 10, wherein the connection between said at least one metal region and said at least one connection ball is performed by a metal via passing through the interconnection substrate.

12. The device according to claim 1, wherein a first end of said at least one metal region is in contact with said at least one contact pad, and wherein a second end of said at least one metal region is in contact with a first thermally-conductive layer that is, itself, in contact with the cover.

13. The device according to claim 12, wherein the first thermally-conductive layer is electrically-insulating.

14. An electronic device, comprising:

an interconnection substrate;

an electronic integrated circuit chip mounted to the interconnection substrate;

a cover;

wherein the electronic chip is located between the cover and the interconnection substrate;

wherein the electronic chip comprises contact pads located in front of a first surface of the interconnection substrate to which the electronic chip is mounted; and at least one metal region extending on the first surface of the interconnection substrate and configured to thermally couple at least one contact pad of the electronic chip to the cover;

wherein said at least one metal region is in contact with a plurality of contact pads of the electronic chip; and wherein said at least one metal region has three teeth, said three teeth including a central tooth that is coupled to two contact pads of the electronic chip, and said three teeth further including two other teeth each of which is connected to one contact pad of the electronic chip.

15. The device according to claim 14, wherein the cover is metallic.

16. The device according to claim 14, wherein the contact pads connected to said two other teeth are adjacent said two contact pads connected to the central tooth.

17. The device according to claim 14, wherein one of the two contact pads connected to the central tooth is located at a corner of the electronic chip.

18. The device according to claim 14, wherein a surface of the electronic integrated circuit chip opposite to the contact pads is in contact with a second thermally-conductive layer itself in contact with the cover.

19. The device according to claim 14, wherein a first end of said at least one metal region is in contact with said at least one contact pad, and wherein a second end of said at least one metal region is in contact with at least one of: the cover or a first thermally-conductive layer that is, itself, in contact with the cover.

20. The device according to claim 14, wherein the interconnection substrate supports connection balls on a second surface, opposite to the first surface, said at least one metal region being electrically connected to at least one connection ball; and wherein the connection between said at least one metal region and said at least one connection ball is performed by a metal via passing through the interconnection substrate.

* * * * *